(12) United States Patent
Altamura et al.

(10) Patent No.: US 9,640,687 B2
(45) Date of Patent: May 2, 2017

(54) METHOD FOR PRODUCING THE P-N JUNCTION OF A THIN-FILM PHOTOVOLTAIC CELL AND CORRESPONDING METHOD FOR PRODUCING A PHOTOVOLTAIC CELL

(71) Applicant: COMMISSARIAT A L'ENERGIE ATOMIQUE ET AUX ENERGIES ALTERNATIVES, Paris (FR)

(72) Inventors: Giovanni Altamura, Grenoble (FR); Louis Grenet, Grenoble (FR); Simon Perraud, Bandol (FR); Frédéric Roux, Saint-Égrève (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/892,462

(22) PCT Filed: May 23, 2014

(86) PCT No.: PCT/IB2014/061659
§ 371 (c)(1),
(2) Date: Nov. 19, 2015

(87) PCT Pub. No.: WO2014/188386
PCT Pub. Date: Nov. 27, 2014

(65) Prior Publication Data
US 2016/0104808 A1    Apr. 14, 2016

(30) Foreign Application Priority Data

May 24, 2013    (FR) ..................... 13 54696

(51) Int. Cl.
*H01L 31/0392* (2006.01)
*H01L 31/032* (2006.01)
(Continued)

(52) U.S. Cl.
CPC .............. *H01L 31/03923* (2013.01); *H01L 31/022483* (2013.01); *H01L 31/0322* (2013.01);
(Continued)

(58) Field of Classification Search
CPC ................................................ H01L 31/03923
See application file for complete search history.

(56) References Cited

U.S. PATENT DOCUMENTS 5,948,176 A    9/1999  Ramanathan
6,259,016 B1 *  7/2001  Negami ........... H01L 31/02168
                                        136/252
(Continued)

FOREIGN PATENT DOCUMENTS

EP    0 837 511 A2    4/1998
EP    2 375 453 A2    10/2011
EP    2375453 A2 *   10/2011    ......... H01L 31/0392

OTHER PUBLICATIONS

International Search Report mailed Oct. 1, 2014, issued in corresponding International Application No. PCT/IB2014/061659, filed May 23, 2014, 3 pages.

*Primary Examiner* — Scott B Geyer
*Assistant Examiner* — S. M. S Imtiaz
(74) *Attorney, Agent, or Firm* — Christensen O'Connor Johnson Kindness PLLC

(57) ABSTRACT

A method for producing a P-N junction in a thin film photovoltaic cell comprising a deposition step in which are carried out successively: a layer of precursors of a photovoltaic material of type P or N, a barrier layer and a layer of precursors of a semiconducting material of type N or P, this deposition step being followed by an annealing step carried out with a supply of S and/or Se, this annealing step leading to the formation of an absorbing layer of the type P or N and
(Continued)

Figure 1:
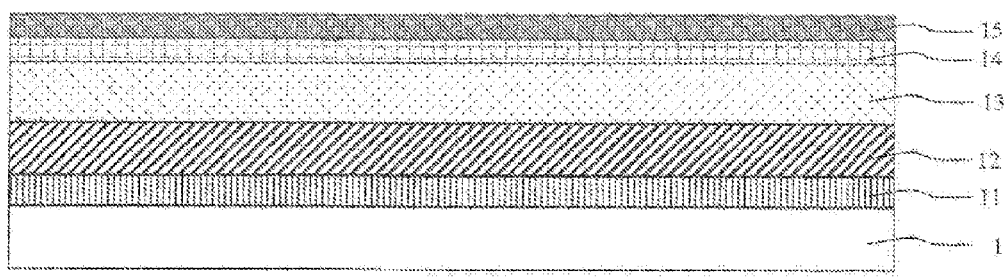

of a buffer layer of type N or P and of a P-N junction at the interface between said layers.

11 Claims, 2 Drawing Sheets

(51) Int. Cl.
    *H01L 31/072*     (2012.01)
    *H01L 31/0749*     (2012.01)
    *H01L 31/0224*     (2006.01)
    *H01L 31/18*     (2006.01)

(52) U.S. Cl.
    CPC ...... *H01L 31/0326* (2013.01); *H01L 31/0392* (2013.01); *H01L 31/072* (2013.01); *H01L 31/0749* (2013.01); *H01L 31/1864* (2013.01); *H01L 31/1884* (2013.01); *Y02E 10/541* (2013.01); *Y02P 70/521* (2015.11)

(56) References Cited

U.S. PATENT DOCUMENTS

| | | | |
|---|---|---|---|
| 8,969,720 B2 * | 3/2015 | Gerbi | C23C 14/0623 136/262 |
| 9,064,700 B2 * | 6/2015 | Wong | C23C 16/306 |
| 9,153,729 B2 * | 10/2015 | Kim | H01L 31/1868 |
| 2007/0257255 A1 * | 11/2007 | Dhere | H01L 31/0322 257/40 |
| 2009/0130796 A1 * | 5/2009 | Taunier | H01L 31/0322 438/94 |
| 2010/0317144 A1 * | 12/2010 | Basol | H01L 21/02568 438/95 |
| 2011/0056541 A1 | 3/2011 | Martinez | |
| 2012/0024366 A1 * | 2/2012 | Liu | H01L 31/0322 136/256 |
| 2012/0067424 A1 * | 3/2012 | Fujdala | H01L 31/022425 136/262 |
| 2014/0162397 A1 * | 6/2014 | Van Duren | H01L 31/0322 438/95 |

* cited by examiner

METHOD FOR PRODUCING THE P-N JUNCTION OF A THIN-FILM PHOTOVOLTAIC CELL AND CORRESPONDING METHOD FOR PRODUCING A PHOTOVOLTAIC CELL

The present invention relates to the field of photovoltaic solar energy and more particularly to thin film photovoltaic cells.

Within the scope of the present application, a <<thin layer>> will be a layer having a thickness of less than 5 μm, or even less than 3 μm.

These photovoltaic cells give the possibility of directly converting the light from the sun into electricity by using the electronic properties of suitable materials.

In practice, the manufacturing of photovoltaic cells involves the formation of a p-n junction between a semi-conductor of type p, in which light is absorbed, and a semi-conductor of type n.

At the interface between the semi-conductors of type p and of type n, an electric field is formed, allowing separation of charges, which is at the basis of photovoltaic conversion.

Thus, a thin film photovoltaic cell generally comprises a substrate for supporting the stack of layers, this stack comprising a metal layer forming the lower electrode, an absorbing layer, of type n or p, for generating charges during absorption of light with minimum transmission and reflection losses, a buffer layer, of type p or n (the buffer layer being of the opposite type to that of the absorbing layer) in order to create the junction with the absorbing layer with a minimum of absorption loss and a transparent conducting electrode for bringing the current to an external circuit.

Each material has particular physical and chemical properties which have an influence on the overall performance of the photovoltaic cell.

Further, any defect at the interface between the buffer layer and the absorbing layer forms an area where the electric charges may recombine. Consequently, it is essential to be able to control the formation of the p-n junction within a photovoltaic cell, in order to avoid the formation of defects.

It should be noted that solar cells in thin layers have advantages as compared with solar cells made in crystalline silicon. This notably results from the fact that they require less material since their absorbing layer has a better optical absorption coefficient.

The absorbing layer of a photovoltaic cell in thin layers may notably be made in a material of the CIGS type, of general formula $Cu(In,Ga)(S,Se)_2$, CdTe or further CZTS, of general formula $Cu_2ZnSn(S,Se)_4$.

These materials lead to different energy conversion yields, this yield being defined as the percentage of solar energy to which the cell is exposed which is converted into electric energy.

Thus, a material of the CIGS type today has the best energy conversion yield since the latter is of about 20%.

The energy conversion yield is of the order of 15% for a material of the CdTe type and of the order of 10% for a material of the CZTS type.

Generally, the p-n junction is made by, first of all, forming the absorbing layer in a material of the CIGS, CZTS or CdTe type and in a second phase the buffer layer.

During the formation of the buffer layer, the surface of the absorbing layer may be contaminated with oxygen. This is particularly the case when the buffer layer is formed by a chemical bath deposition technique (CBD).

This oxidation leads to the formation of defects.

Thus, it was able to be shown that with a material of the CIGS and CZTS type, the period of time separating the formation of the absorbing layer and the deposition of the buffer layer plays a major role in the final performances of a photovoltaic cell.

In order to reduce the risks of contamination of the p-n junction by oxidation, two solutions have already been proposed in the state of the art: the use of a superstrate structure and the use of a vacuum process.

A solar cell may have a structure of the substrate or superstrate type.

In a structure of the substrate type, the manufacturing of the solar cell begins by forming on a substrate a metal layer forming the lower electrode on which is then made an absorbing layer, for example of type p. This absorbing layer may notably appear as a thin film in CIGS or CZTS.

The buffer layer, in a semi-conducting material of type n, is then deposited on the absorbing layer. The cell is finished by depositing a conductive transparent electrode.

The same stack of layers may also be obtained by depositing the layers in the opposite direction, so as to obtain a structure of the superstrate type.

Thus, the manufacturing of the solar cell of the superstrate type begins by depositing a conductive transparent electrode on a transparent substrate. A buffer layer of type n is then deposited on this conductive transparent electrode, an absorbing layer of type p then being formed on the buffer layer.

The manufacturing of the solar cell is ended by forming a metal layer forming a rear electrode.

Both of these structures have substantial differences as regards the selection of the materials which may be used and of the processes which may be applied.

In particular, the major advantage of the structure of the superstrate type is that no oxidation of the absorbing layer may occur at the interface with the buffer layer.

This configuration however has one drawback.

Indeed, the formation of the absorbing layer is carried out at relatively high temperatures. This may lead to chemical diffusion from the buffer layer into the absorbing layer.

Thus, when the buffer layer is made in CdS, temperatures above 450° C., required for forming the absorbing layer, lead to diffusion of Cd into the absorbing layer.

This is why today, the energy conversion yield of a solar cell having a structure of the superstrate type comprising a p-n junction between an absorbing CIGS layer and a buffer CdS layer is limited to about 7%.

Solar cells having a structure of the superstrate type with a buffer layer in ZnS or ZnO have better yields, for example of the order of 11% in the case of ZnO. However, these materials nevertheless lead to significant chemical diffusion from the buffer layer into the absorbing layer.

Moreover, regardless of the retained structure type, the p-n junction is always formed in two steps, the absorbing layer and the buffer layer being made independently of each other.

In this respect, mention may be made of document EP-2 339 641.

It was also proposed to make the p-n junction of a solar cell by applying a vacuum process.

This method has the advantage of being able to be easily applied on an industrial scale since it may be integrated into a completely online system leading to significant production volumes.

Especially, this method gives the possibility of avoiding oxidation of the surface of the absorbing layer.

However, with such a method, the p-n junction is always formed in two successive steps.

Depositing the buffer layer by a physical vapor deposition (or PVD) technique was also contemplated, in order to avoid contamination of the absorbing layer with oxygen.

However, it was shown that at least for solar cells including an absorbing CIGS layer and a CdS buffer layer, the obtained energy conversion yield was then significantly less than the one obtained when the buffer layer was deposited by a chemical bath deposition technique (CBD).

Indeed, a difference of the order of 7% corresponding to a yield of 20% with a CdS layer obtained by a CBD technique and to a yield of 13% with a CdS layer obtained by a PVD technique may actually be ascertained.

This is notably due to the fact that the CBD technique damages less the surface of the absorbing layer than the PVD technique. This observation remains valid for other constitutive materials of the buffer layer.

Finally, for materials forming the absorbing layer of the CIGS, CZTS and CdTe type, the best performances are obtained when the p-n junction is formed with a buffer layer made in a material of the CdS type, deposited by a chemical bath deposition technique.

However, cadmium is a toxic element.

The object of the invention is to overcome the drawbacks of known methods by proposing a method for making a p-n junction in a thin film photovoltaic cell which gives the possibility of avoiding the formation of defects at this junction notably resulting from oxidation, which is of a simplified application and which may give the possibility of avoiding the use of cadmium.

Thus, the method according to the invention comprises a deposition step in which are successively made: a layer of precursors of a photovoltaic material of type p or n, a barrier layer and a layer of precursors of a semi-conducting material of type n or p, this deposition step being followed by a single annealing step carried out with a supply of S and/or Se, this annealing step leading to the formation of an absorbing layer of type p or n and of a buffer layer of type n or p and of a p-n junction at the interface between said layers, the barrier layer preventing chemical diffusion and oxidation at the interface between the absorbing layer and the buffer layer during said annealing step.

This method gives the possibility of both avoiding oxidation and chemical diffusion at the interface between the absorbing layer and the buffer layer while producing the photovoltaic layer and the buffer layer during the same annealing step. This therefore leads to a p-n junction of very good quality with a method for which the application is simplified.

Preferably, the precursors of a photovoltaic material of type p or n comprise metal precursors of Cu, Zn, Sn or of Cu, Ga and In.

In a first alternative, a layer of Se and/or S is deposited on the layer of precursors of a photovoltaic material of type p or n, before deposition of the barrier layer.

In a second alternative, the precursors of a photovoltaic material also comprise selenium and/or sulfur compounds of said metal precursors.

Preferably, the precursor of a semi-conducting material of type n or p is indium and leads to the formation of a buffer layer in $In_2S_3$.

This gives the possibility of avoiding the use of cadmium which is a toxic element.

During the annealing step, the sulfur and selenium are advantageously provided in gaseous form.

The annealing step is carried out, preferably, at a temperature comprised between 400 and 650° C., with temperature raising ramps comprised between 1° C./s and 15° C./s.

Moreover, the barrier layer is formed with a nitride or oxide. It is advantageously a layer of $Si_3N_4$, $SiO_2$ or $TiO_2$.

The invention also relates to a method for producing a thin film photovoltaic cell.

This method comprises the following steps:
producing a rear-face electrode on a substrate,
applying the method for producing a p-n junction according to the invention and
producing a front-face, transparent and conductive electrode.

Advantageously, the rear-face electrode is a molybdenum layer.

Preferably, an intrinsic ZnO layer is deposited before applying the method for producing a p-n junction according to the invention and before producing the conductive transparent electrode.

This transparent and conductive electrode is advantageously made in ZnO doped with Al.

The invention also relates to a thin film photovoltaic cell successively comprising a rear-face electrode, an absorbing layer in a photovoltaic material of type p or n, a barrier layer, a buffer layer of the n or p type and a front-face transparent and conductive electrode, with a p-n junction at the interface between the absorbing layer and the buffer layer.

Advantageously, the barrier layer is formed with a nitride or oxide and the buffer layer is made in $In_2(S, Se)_3$ or further in $Zn(O, S)$ or $Zn(O, Se)$.

Figure 2:
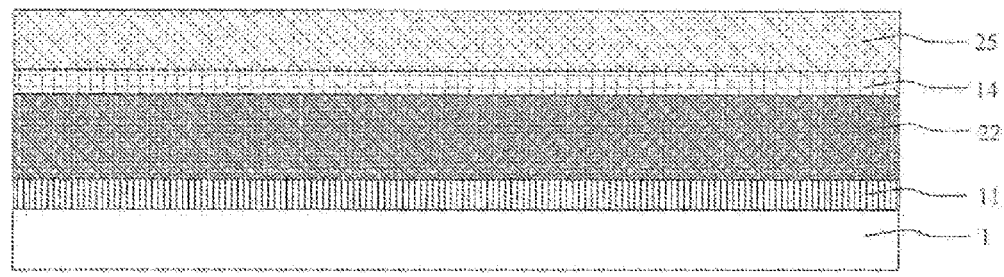
Figure 3:
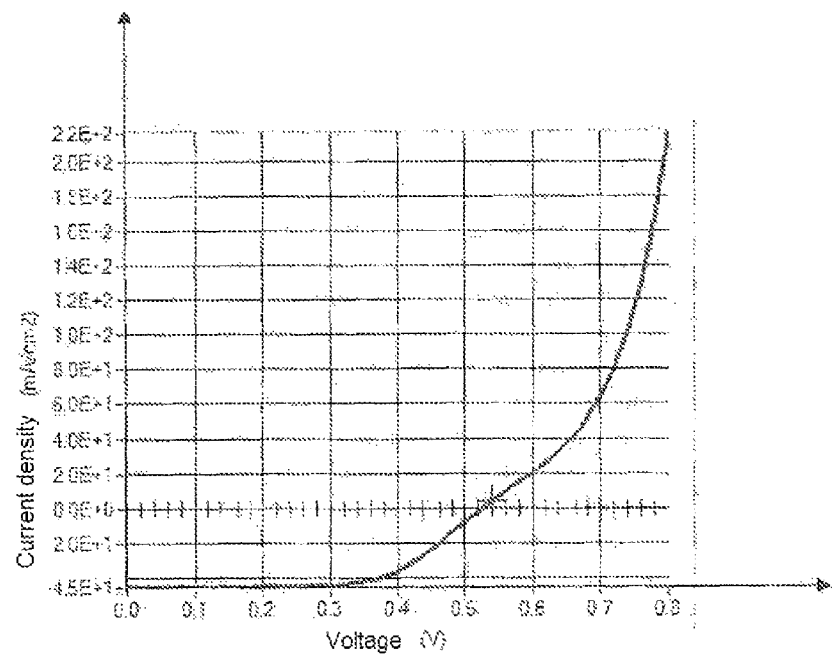
Figure 4:
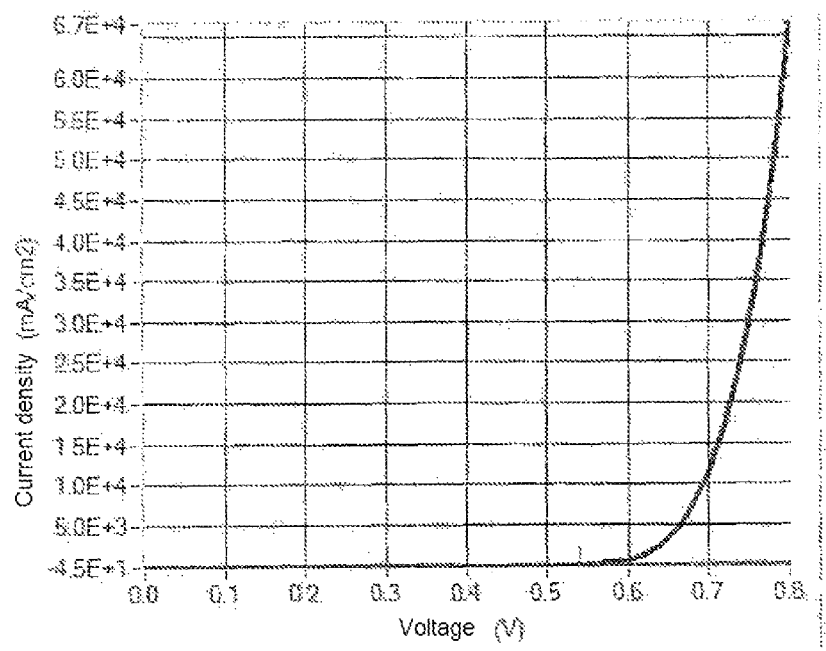

The invention will be better understood and other objects, advantages and features of the latter will become more clearly apparent upon reading the description which follows and which is made with reference to the appended drawings, wherein:

FIG. 1 is a sectional view of a stack of layers obtained after the deposition step of the method according to the invention, FIG. 2 is a sectional view of a stack of layers obtained after the annealing step of the method according to the invention, FIG. 3 is a graph giving the current density versus the voltage for a solar cell obtained by the method according to the invention, and FIG. 4 is a graph giving the current density versus the voltage for a solar cell similar to the one which is the subject of the graph of FIG. 3 but obtained by a conventional method.

The elements common to various figures will be designated with the same references.

With reference to FIG. 1, the method for producing a photovoltaic cell according to the invention first of all consists of depositing on a substrate 1, a metal layer 11 forming a rear-face electrode for the photovoltaic cell which will be obtained by the method according to the invention.

The substrate 1 may be made in various materials, conventionally in glass, in plastic or in metal. Generally, this substrate is made in a sodalime glass and has a thickness comprised between 1 and a few millimeters of thickness. Flexible, metal or plastic substrates may also be contemplated. The layer 11 is for example made in molybdenum and its thickness is comprised between 100 nm and 2 μm and it is notably equal to 500 nm.

The deposition of the molybdenum layer may notably be achieved by cathode sputtering.

On the layer 11, are then deposited, as a layer 12, the precursors which will lead to the formation of the photovoltaic layer.

These are metal precursors of Cu, Zn, Sn and optionally at least one element taken from Se and S.

As an example, the ratios of the Cu, Zn and Sn elements are conventionally selected so that $$0.75 \leq Cu/(Zn+Sn) \leq 0.95 \text{ and } 1.05 \leq Zn/Sn \leq 1.35.$$

This layer 12 may essentially include metal precursors. In this case, the sulfur and/or selenium are then provided in gaseous form.

They may also be provided in the form of a layer 13 deposited on the layer of metal precursors.

Moreover, the layer 12 may be a layer of metal precursors and/or of their corresponding selenium and/or sulfur compounds. Thus, the layer 12 may be a layer of Cu, Zn and Sn and/or of their selenium or sulfur compounds such as CuSe, CuS, ZnSe, ZnS, SnSe, SnS, or any combination of these compounds. In this case, it is not necessary to provide a layer 13 consisting of sulfur and/or selenium.

Generally, within the scope of the invention, provision of selenium and/or sulfur is preferred in the form of a deposit in the stack. Indeed, it is then easier to control the final composition of the photovoltaic layer than with a provision in gaseous form.

Thus, as an example, the layer 12 may include three successive layers, a ZnS layer, a copper layer and a tin layer, the order of these layers may be modified.

The thickness of the ZnS layer may then be of about 350 nm, that of the copper layer of about 120 nm and that of the tin layer of about 160 nm.

In this case, the layer 13 may be a selenium layer and have a thickness of about 2 μm.

Many deposition methods suitable for forming thin layers may be used for producing the layers 12 and 13.

These may be vacuum processes, such as evaporation or cathode sputtering or processes applied at atmospheric pressure, such as electrodeposition, screen printing, doctor-blading, inkjet or slit-coating.

A barrier layer 14 is then directly deposited on the layer of precursors 12 or on the layer 13 of S and/or Se when it is provided. This layer is continuous.

As this will be explained subsequently, this barrier layer gives the possibility of avoiding chemical diffusion of components and oxidation.

This barrier layer is formed with a compound based on a nitride or oxide. It may notably be made in $Si_3N_4$, $SiO_2$ or $TiO_2$. Its thickness is from a few nanometers and for example equal to 4 nm.

Finally, on layer 14, is then deposited a layer 15 of at least one precursor of a semiconducting material for which the doping will be of type n if the obtained photovoltaic material from layers 12 and 13 is of type p and vice versa.

Thus, this layer 15 may notably be made in indium or zinc and its thickness will be from a few tens of nanometers and for example of about 30 nm.

Once this stack is made, it is subject to an annealing step, carried out with a provision of S and/or Se.

The chalcogen S or Se may then be provided as an elementary gas or as a gas of the $H_2S$ or $H_2Se$ type.

This annealing step leads to the formation of an absorbing layer 22 in photovoltaic material and of a buffer layer 25.

This annealing step does not modify the barrier layer 14.

This annealing step, conventionally designated as a selenization/sulfurization anneal, is carried out at a high temperature.

This annealing step may notably be carried out by using a temperature raising ramp comprised between 1° C./s and 15° C./s so as to obtain a temperature comprised between 500 and 650° C. and for example equal to 550° C.

The duration of the plateau at a high temperature may be comprised between 30 seconds and 30 minutes, and it is advantageously equal to 3 minutes.

This temperature allows crystallization of the metal precursors in CIGS or CZTS, in order to obtain the layer 22.

This annealing step also allows transformation of the precursor(s) present in the layer 15 into a material forming the buffer layer 25.

With the examples of materials given earlier, the layer 25 is then formed in $In_2(S, Se)_3$ or further in $Zn(O, S)$ or $Zn(O, Se)$.

Moreover, with the thickness values of the different layers given in the previous example, the annealing step leads to a layer 22 in $CZT(S, Se)$ with a thickness of 1.2 μm, while the layer 25 in $In_2(S, Se)_3$ is of about 50 nm.

During this annealing step, the barrier layer 14 prevents the diffusion of the components present in the layer 12, notably of indium or zinc, into the photovoltaic material of the layer 22. It therefore gives the possibility of avoiding oxidation between the absorbing layer and the buffer layer during annealing.

However, it should be noted that this annealing step may be accompanied by the formation of a layer of $Mo(S, Se)_2$ at the interface between the molybdenum layer 11 and the layer 22 in a photovoltaic material.

The thickness of the $Mo(S, Se)_2$ layer depends on many parameters, notably on the amount of provided S/Se. It may be estimated to be comprised between 5 and 100 nm. It is known that its presence promotes contact of the ohmic type at the interface with the absorbing layer 22, notably in CIGS.

After this annealing step, the formation of a photovoltaic cell further requires the deposition of a transparent and conductive front-face electrode (not shown in the figures).

This front-face electrode is made in a transparent and conductive material.

It may notably consist of ZnO doped with Al.

The thickness of this layer is typically comprised between 100 and 800 nm and preferably equal to about 500 nm.

The material forming this transparent and conductive electrode may notably be deposited by cathode sputtering.

It should further be noted that before the deposition of this layer forming the front-face electrode, it is possible to deposit on the buffer layer 25, a layer of a material transparent in the solar spectrum and strongly resistive.

This layer is typically made in intrinsic ZnO and may have a thickness of a few tens of nanometers, and notably 50 nm for the solar cell given as an example earlier.

The constitutive material of this layer may typically be deposited by cathode sputtering.

This layer is optional and it may be omitted without causing any significant degradation of the electrical performances of the photovoltaic cell.

Now reference is made to FIGS. 3 and 4 which are graphs giving the current density (in mA/cm$^2$) versus voltage (in V).

These graphs result from simulations made with the SOAPS piece of software of the solar cell given as an example earlier, for FIG. 3 and of a similar cell but obtained by a conventional method, for FIG. 4.

These graphs give the possibility of illustrating the operation of each of these cells.

Thus, for FIG. 3, this is a solar cell for which the lower or rear-face electrode is a molybdenum layer, for which the thickness is 500 nm, an absorbing layer in CZT (S, Se) for which the thickness is of about 1.2 μm, a barrier layer in $Si_3N_4$ for which the thickness is of about 4 nm, a buffer layer in $In_2(S, Se)_3$ with a thickness of about 50 nm, a ZnO layer for which the thickness is of about 50 nm and finally a ZnO layer doped with Al for which the thickness is of about 500 nm.

This solar cell is obtained with the method according to the invention.

For FIG. 4, the solar cell includes the same layers, except as regards the barrier cell which is absent.

Comparison of FIGS. 3 and 4 shows that each solar cell according to the invention operates in the same way as a similar solar cell, obtained by a conventional method and not including any barrier layer.

Thus, FIG. 3 shows that it is possible to obtain separation of the charges even if a barrier layer is provided at the p-n junction. In practice, this separation of the charges is possible since the electrons present in the conduction band are able to cross the barrier layer by the tunnel effect.

It should further noted that with the cell obtained by the method according to the invention and with a similar cell obtained according to a conventional method and without any barrier layer, the two following quantities remain unchanged: the open circuit voltage Voc (in V) and the short-circuit current density Jsc (in $mA/cm^2$). Indeed, for Voc, a value of 0.5263 V is measured for the cell of FIG. 3 and a value of 0.5228 V for the cell of FIG. 4. Moreover, for Jsc, a value of 45.2830 $mA/cm^2$ is measured for the cell of FIG. 3 and a value of 45.3024 $mA/cm^2$ for the cell of FIG. 4.

As regards the form factor FF and the energy conversion yield, the corresponding values for the cell of FIG. 3 obtained by the method according to the invention is 63.27% and 15.08%. These values are respectively 78.46% and 18.58% for the cell of FIG. 4.

Thus, the energy conversion yield of the solar cell of FIG. 3 is greater than the one obtained for solar cells having a structure of the superstrate type or for which the p-n junction is obtained by a vacuum process, all these cells avoiding oxidation of the absorbing layer.

Moreover, as compared with all the known methods, and notably the one used for producing the solar cell of FIG. 4, the method according to the invention gives the possibility of producing in a single annealing step both the absorbing layer and the buffer layer of a solar cell.

This shows that the method according to the invention actually gives the possibility of obtaining a solar cell operating satisfactorily, while avoiding the risks of oxidation and chemical diffusion at the interface between the absorbing layer and the buffer layer and the use of cadmium and by being of a simplified application.

The reference symbols inserted after the technical characteristics appearing in the claims have the sole purpose of facilitating the understanding of the latter and cannot limit the scope thereof.

The invention claimed is:

1. A method for producing a P-N junction in a thin film photovoltaic cell comprising a deposition step in which are successively carried out: a layer of precursors of a photovoltaic material of type P or N, a barrier layer, and a layer of precursors of a semiconducting material of type N or P, this deposition step being followed by a single annealing step carried out with a supply of S or Se or both S and Se, this annealing step leading to the formation of an absorbing layer of type P or N and of a buffer layer of type N or P and of a P-N junction at the interface between said absorbing and buffer layers, said annealing step allowing transformation of said precursors of a semiconductor material of type N or P into a material forming said buffer layer, the barrier layer preventing chemical diffusion and oxidation at the interface between the absorbing layer and the buffer layer during this annealing step.

2. The method according to claim 1, wherein the precursors of a photovoltaic material of type N or P comprise metal precursors of Cu, Zn, Sn or of Cu, Ga and In.

3. The method according to claim 1, wherein a layer of Se or S or both S and Se is deposited on the layer of precursors of a photovoltaic material of type P or N, before depositing the barrier layer.

4. The method according to claim 1, wherein the precursors of a photovoltaic material also comprise selenium or sulfur compounds or compounds of both selenium and sulfur of metal precursors.

5. The method according to claim 1, wherein the precursor of a semiconducting material of type N or P is indium.

6. The method according to claim 1, wherein, during the annealing step, the sulfur and selenium are provided in gaseous form.

7. The method according to claim 1, wherein that the annealing step is carried out at a temperature comprised between 400° and 650° C., with temperature raising ramps comprised between 1° C./s and 15° C./s.

8. The method according to claim 1, wherein the barrier layer is formed with a nitride or an oxide.

9. A method for producing a thin film photovoltaic cell comprising:
   producing a rear-face electrode on a substrate;
   applying the method according to claim 1; and
   producing a transparent and conductive front-face electrode.

10. The method according to claim 9, wherein the rear-face electrode is a molybdenum layer, while the front-face electrode is a ZnO layer doped with Al.

11. The method according to claim 9, wherein an intrinsic ZnO layer is deposited after applying the method for producing the P-N junction and before producing the front-face electrode.

* * * * *